(12) United States Patent
Yoshizaki et al.

(10) Patent No.: US 6,873,045 B2
(45) Date of Patent: Mar. 29, 2005

(54) SEMICONDUCTOR MODULE AND POWER CONVERSION DEVICE

(75) Inventors: Atsuhiro Yoshizaki, Hitachinaka (JP); Keiichi Mashino, Hitachinaka (JP); Hiromichi Anan, Nishiibaraki (JP); Yoshitaka Ochiai, Hitachi (JP)

(73) Assignees: Hitachi, Ltd., Tokyo (JP); Hitachi Car Engineering Co., Ltd., Ibaraki (JP)

( * ) Notice: Subject to any disclaimer, the term of this patent is extended or adjusted under 35 U.S.C. 154(b) by 0 days.

(21) Appl. No.: 10/610,822

(22) Filed: Jul. 2, 2003

(65) Prior Publication Data
US 2004/0012064 A1 Jan. 22, 2004

(30) Foreign Application Priority Data
Jul. 3, 2002 (JP) .................................. 2002-194077

(51) Int. Cl.⁷ .................... H01L 23/52; H01L 29/40; H01L 23/48
(52) U.S. Cl. .................... 257/735; 257/736
(58) Field of Search .................. 257/735, 736, 257/706, 707, 776, 691

(56) References Cited
U.S. PATENT DOCUMENTS 5,218,231 A * 6/1993 Kudo ........................ 257/735
6,072,240 A    6/2000 Kimura et al.
6,396,127 B1 * 5/2002 Munoz et al. ............... 257/666
6,479,888 B1 * 11/2002 Hirashima et al. .......... 257/673
6,521,982 B1 * 2/2003 Crowley et al. ............ 257/676
6,528,880 B1 * 3/2003 Planey ........................ 257/735
6,697,257 B1    2/2004 Wolf et al.
2001/0050421 A1   12/2001 Kono
2002/0005272 A1    1/2002 Hirano et al.

FOREIGN PATENT DOCUMENTS

| DE | 19950026 A1 | 4/2001 |
| EP | 0361495 A2 | 4/1990 |
| EP | 1014451 A1 | 6/2000 |
| EP | 1111677 A2 | 6/2001 |
| FR | 2786657 A1 | 6/2000 |
| JP | 10-056131 | 2/1998 |

* cited by examiner

*Primary Examiner*—S. V. Clark
(74) *Attorney, Agent, or Firm*—Crowell & Moring LLP

(57) ABSTRACT

One method of achieving the above subjects is by connecting one of electroconductive members 12, which are pre-connected to the top and bottom of a semiconductor chip 11 and have thermal conductivity, to an electroconductive member 13, which is used with the semiconductor chip 11 to constitute a laminated structure, in electrically insulated form on the same surface as the installation surface of the electroconductive member 13 so as to straddle the laminated structure constituted by the semiconductor chip 11 and the electroconductive member 13.

18 Claims, 7 Drawing Sheets

SEMICONDUCTOR MODULE AND POWER CONVERSION DEVICE

BACKGROUND OF THE INVENTION

The present invention relates to a semiconductor module and a power conversion device using the same.

Some types of power conversion devices comprise a semiconductor module in which chip-like semiconductor devices are mounted in packaged IC form. A large majority of power conversion devices, however, comprise a semiconductor module in which semiconductor devices are mounted as they are. The latter is intended to improve the cooling effect of the semiconductor module by directly releasing the heat emitted from the semiconductor devices.

Examples of the products known as semiconductor modules of this conventional type are disclosed in Japanese Laid-Open Patent Publication No. Hei 10-56131. Various products designed so that the heat emitted from the respective semiconductor chips is released from the two principal faces of each semiconductor chip are proposed in Japanese Laid-Open Patent Publication No. Hei 10-56131.

These products include, for example, a semiconductor module having each semiconductor chip sandwiched between insulating substrates and having these insulating substrates further sandwiched between copper plates so that the heat emitted from the semiconductor chip is released from the two principal faces thereof.

SUMMARY OF THE INVENTION

For the power conversion devices used under a severe heat-cycle environment, such as the power conversion device mounted in an automobile, as the standards pertaining to power supplies are tightened, the magnitude of the current flowing through semiconductor devices increases and this, in turn, increases the heat emitted from the semiconductor devices and makes the heat cycle even severer. It is therefore demanded that the cooling performance of the semiconductor modules constituting the power conversion device should be further improved over the cooling performance of conventional semiconductor modules.

The present invention is to provide a semiconductor module that can be improved in cooling performance. The present invention is also to provide a highly reliable, compact, and inexpensive power conversion device that can maintain normal operation even when used under a severe heat-cycle environment.

In order to achieve the above, the present invention features a semiconductor module in which one of electroconductive members, each connected to either the top or bottom of a semiconductor device and having thermal conductivity, is connected under an electrically insulated status to the other electroconductive member on the same surface as the installation surface of the other electroconductive member so as to straddle the other laminated structure formed by the semiconductor device and the electroconductive members.

DETAILED DESCRIPTION OF THE PREFERRED EMBODIMENTS

Figure 8:
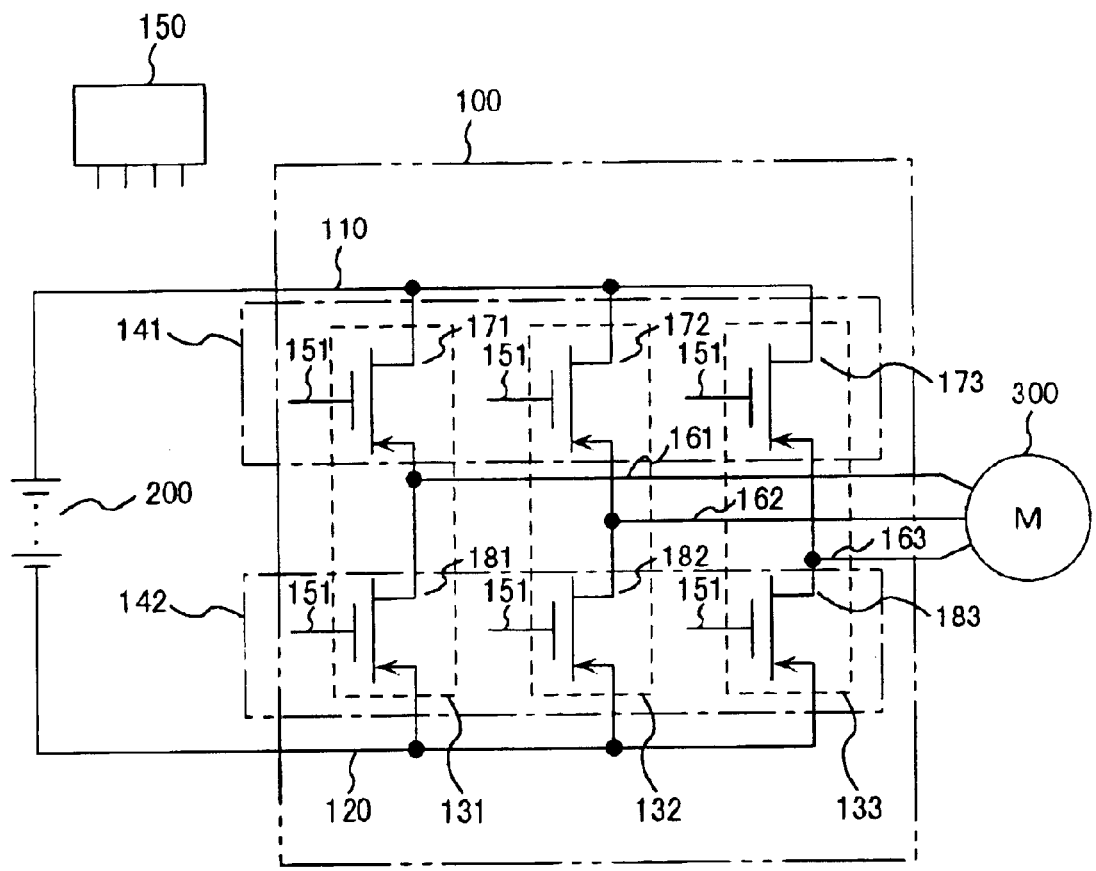
FIG. 8 is a circuit diagram showing the circuit composition of the inverter device of FIG. 1.
Figure 9:
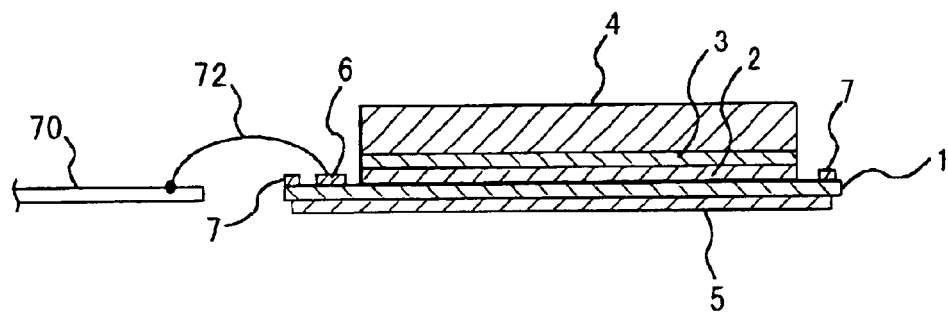
FIG. 9 is a cross-sectional view of the semiconductor chip, showing other wiring connection structure between the gate electrode of the semiconductor chip and the wiring member.
Figure 10:
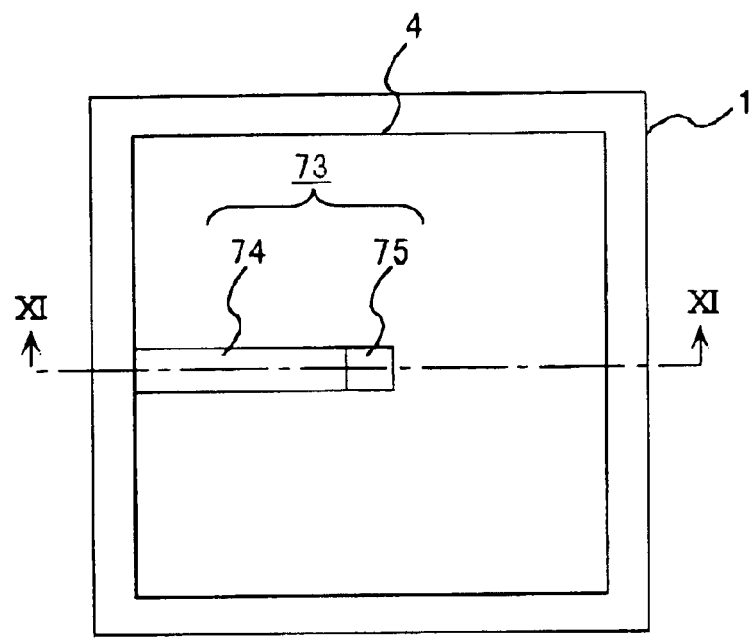
FIG. 10 is a top plan view of the semiconductor chip, showing other wiring connection structure between the gate electrode of the semiconductor chip and the wiring member.
Figure 11:
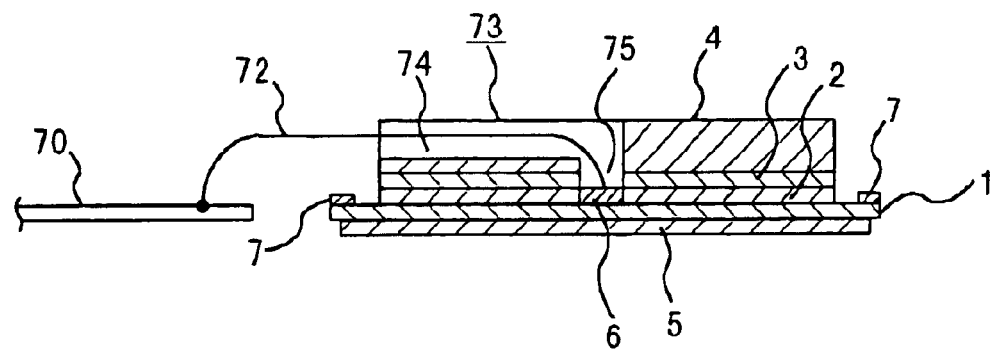
FIG. 11 is a cross-sectional view of the section XI–XI' when seen from the direction of the arrow in FIG. 10.
Figure 12:
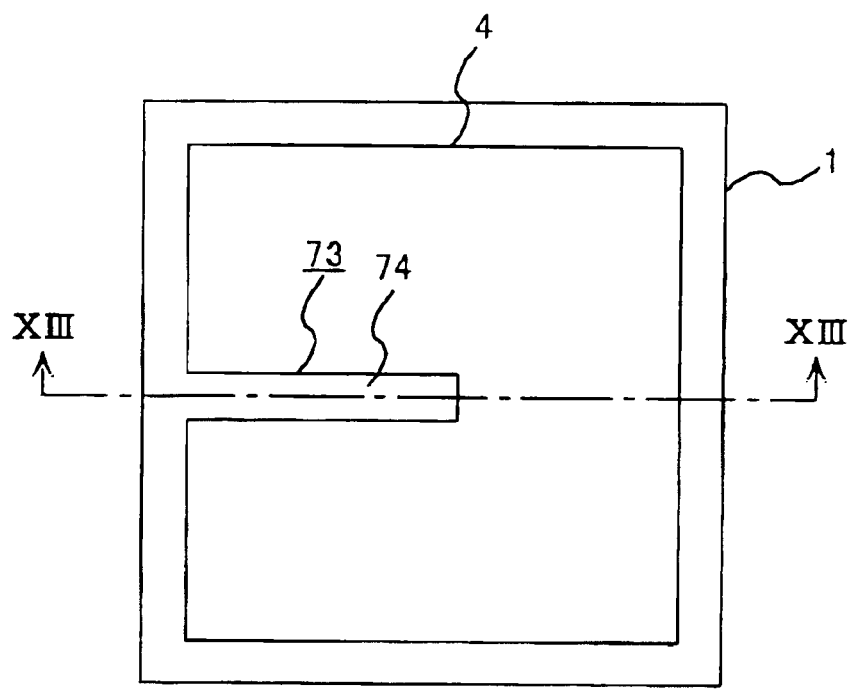
FIG. 12 is a top plan view of the semiconductor chip, showing other wiring connection structure between the gate electrode of the semiconductor chip and the wiring member.
Figure 13:
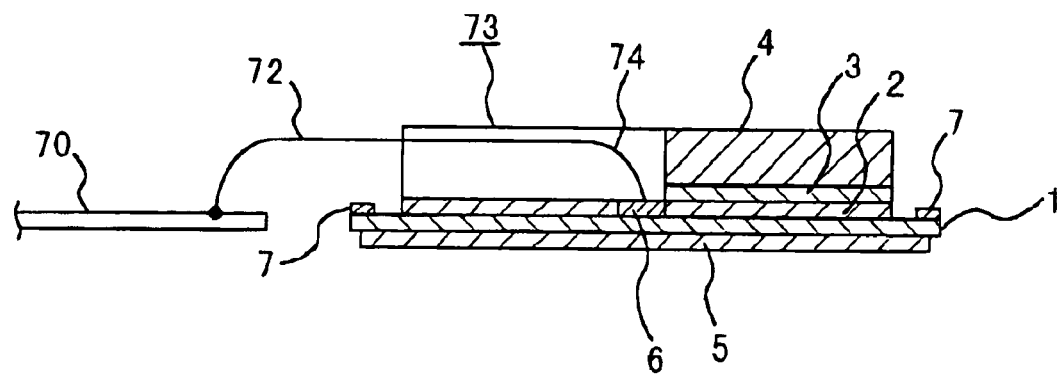
FIG. 13 is a cross-sectional view of the section XIII–XIII' when seen from the direction of the arrow in FIG. 12.

A first embodiment of the present invention is described below in accordance with FIGS. 1 to 8. FIG. 8 shows the circuit composition of a power conversion device in the present embodiment. The power conversion device in the present embodiment is intended to be mounted in the motor-driving system of an automobile (for example, a motor-driving system for an electric automobile or a hybrid automobile, or a motor-driving system for automotive motor loads such as an air conditioner and brakes), and this power conversion device is described below taking as an example an inverter device 100 by which the DC power from a battery 200 (operating at, for example, a charging voltage of 42 V) is to be converted into three-phase AC power and then supplied to an AC motor 300 (for example, a synchronous motor, an induction motor, or the like).

The inverter device 100 is constructed so that the DC power of the battery 200 that has been supplied via a positive-pole DC bus 110 and a negative-pole DC bus 120 is first converted into AC power, for each phase, during the switching operation of the MOS-FETs 171, 172, and 181 to 183 controlled by the gate control signal 151 of a control circuit block 150, and then supplied to the AC motor 300 via the AC output buses 161 to 163 corresponding to each phase. More specifically, conversion circuits 131 to 133 are constituted by the MOS-FETs 171 to 173 which form an upper arm 141, and the MOS-FETs 181 to 183 which form a lower arm 142.

The conversion circuit 131 of a u-phase comprises the MOS-FET 171 of the upper arm 141 and the MOS-FET 181 of the lower arm 142. The drain side of the MOS-FET 171 is connected to the positive-pole DC bus 110, and the source side is connected to the AC output bus 161. The source side of the MOS-FET 181 is connected to the negative-pole DC bus 120, and the drain side is connected to the AC output bus 161.

The conversion circuit 132 of a v-phase comprises the MOS-FET 172 of the upper arm 141 and the MOS-FET 182 of the lower arm 142. The drain side of the MOS-FET 172 is connected to the positive-pole DC bus 110, and the source side is connected to the AC output bus 162. The source side of the MOS-FET 182 is connected to the negative-pole DC bus 120, and the drain side is connected to the AC output bus 162.

The conversion circuit 133 of a w-phase comprises the MOS-FET 173 of the upper arm 141 and the MOS-FET 183 of the lower arm 142. The drain side of the MOS-FET 173 is connected to the positive-pole DC bus 110, and the source side is connected to the AC output bus 163. The source side of the MOS-FET 183 is connected to the negative-pole DC bus 120, and the drain side is connected to the AC output bus 163.

Although the present embodiment described above uses MOS-FETs as the semiconductor devices constituting the conversion circuits, these conversion circuits can likewise be composed using other switching elements such as IGBTs or bipolar transistors.

FIGS. 1 to 5 show the configuration of an actual inverter device 100 having the circuit composition of FIG. 8. The inverter device 100 comprises: a positive-pole semiconductor module 10 forming the upper arm 141; a negative-pole semiconductor module 20 forming the lower arm 142; a busbar 30 forming a positive-pole DC bus 110, a negative-pole DC bus 120, and AC output buses 161 to 163; an insulating member 50, and; a heat-releasing member 60. Although the inverter device 100 further has the control circuit block 150 mentioned in connection with FIG. 8, this control circuit block is not shown in FIGS. 1 to 5.

The positive-pole semiconductor module 10 and the negative-pole semiconductor module 20 are arranged linearly in proximity to each other on the insulating member 50. The insulating member 50 is a ceramic flat-plate-like or sheet-like member formed from a material high in thermal conductivity, such as aluminum nitride. The heat-releasing member 60 is connected to the bottom of the insulating member 50. The heat-releasing member 60 is a fin-like heat-conductive member made of a metal such as aluminum.

The positive-pole semiconductor module 10 has three semiconductor chips 11 which form the MOS-FETs 171 to 173 mentioned in connection with FIG. 8. The negative-pole semiconductor module 20 has three semiconductor chips 21 which form the MOS-FETs 181 to 183 mentioned in connection with FIG. 8.

The semiconductor chips 11 and 21 in the positive-pole semiconductor module 10 and the negative-pole semiconductor module 20, respectively, are arranged linearly in proximity to each other in a vertical direction with respect to the orienting direction of the positive-pole semiconductor module 10 and the negative-pole semiconductor module 20 (hereinafter, the orienting direction of the two elements is referred to as the "first direction", and the direction in which the semiconductor chips are arranged is referred to as the "second direction"). In the positive-pole semiconductor module 10 and the negative-pole semiconductor module 20, the semiconductor chips 11 and 21 forming the conversion circuits of the same phase have an opposed relationship in position with respect to the first direction.

The semiconductor chip 11 is a flat-plate-like structure constituted by top, bottom, and four sides, and has: a silicon chip 1 consisting of a source electrode 2, a gate electrode 6 (control electrode), and a guard ring 7 at top, and a drain electrode 5 at bottom, and; a source electrode connecting member 4 connected to the source electrode 2 via solder 3.

Figure 1:
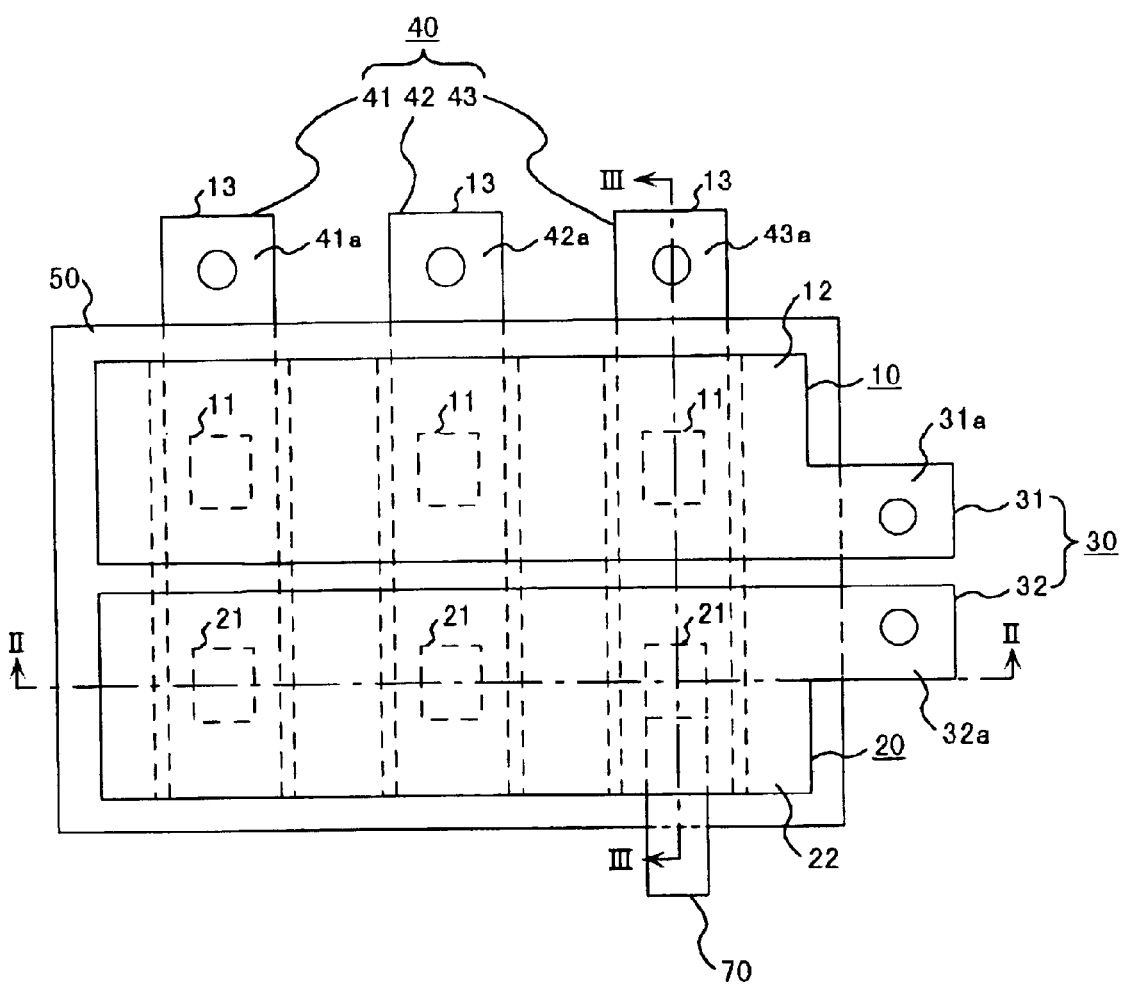
FIG. 1 is a top plan view showing the configuration of an inverter device as a first embodiment of the present invention.
Figure 2:
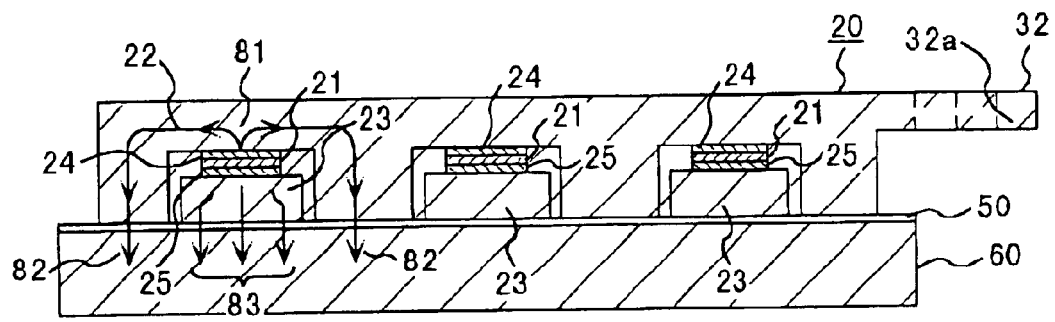
FIG. 2 is a cross-sectional view of the section II–II' when seen from the direction of the arrow in FIG. 1.
Figure 3:
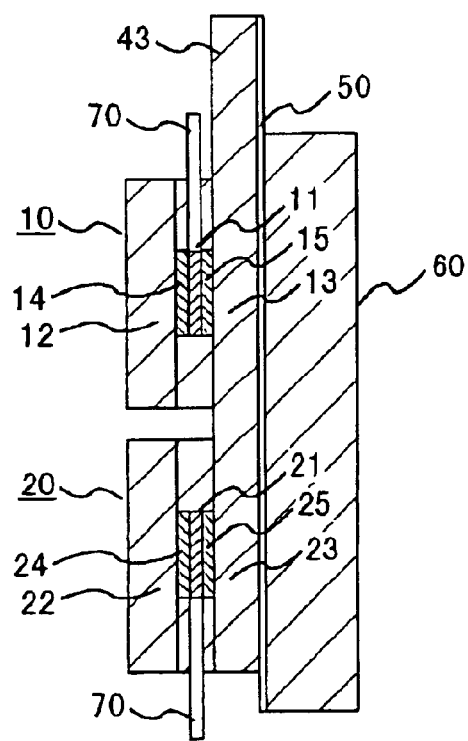
FIG. 3 is a cross-sectional view of the section III–III' when seen from the direction of the arrow in FIG. 1.
Figure 4:
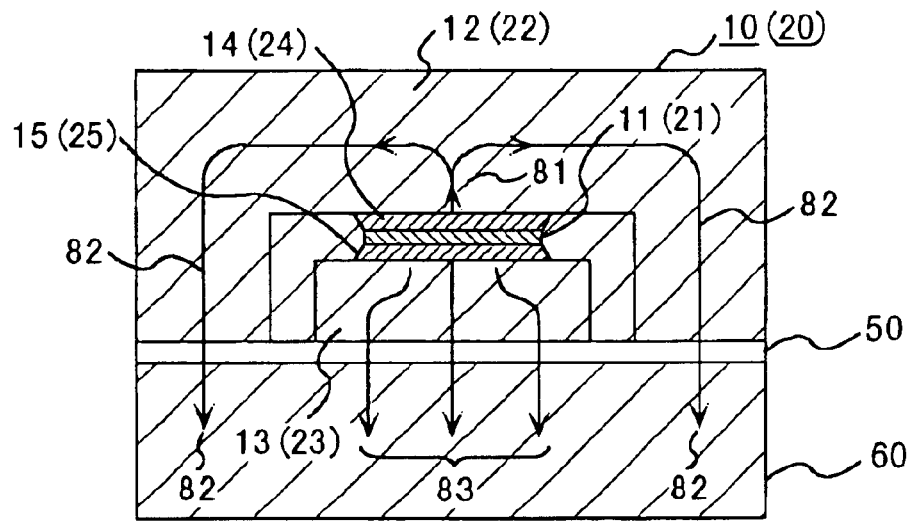
FIG. 4 is a cross-sectional view showing in enlarged form the configuration of one phase in FIG. 2.
Figure 5:
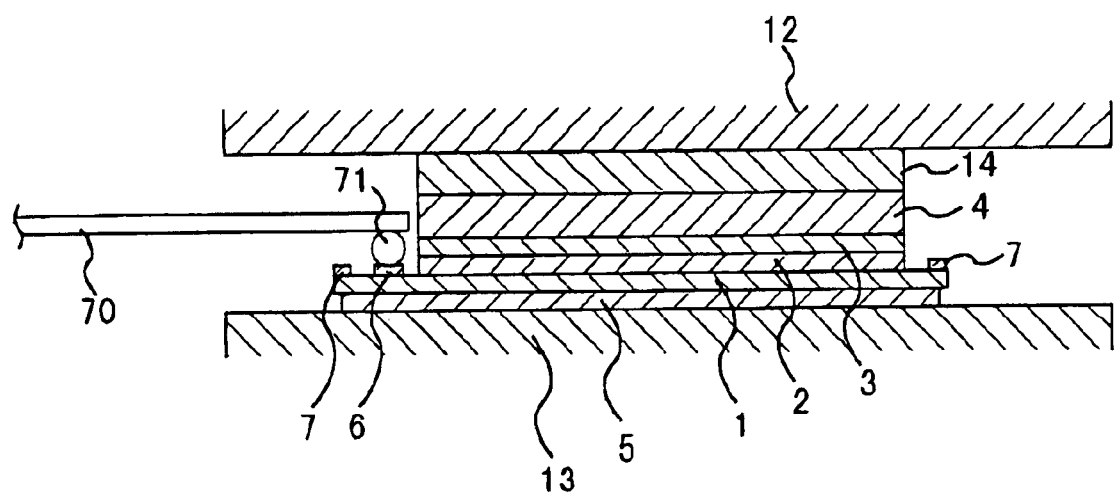
FIG. 5 is a cross-sectional view showing in enlarged form the configuration of the semiconductor chip of FIG. 4.

Although the semiconductor chip 21 has the same construction as that of the semiconductor chip 11, both the top and bottom of the semiconductor chip 21 face in the opposite directions to those of the semiconductor chip 11 (that is to say, the semiconductor chip 21 is structurally rotated through 180 degrees with respect to the vertical direction of FIG. 5). A drain electrode is positioned at the top of the semiconductor chip 21, and a source electrode, a gate electrode, and a guard ring are positioned at bottom. The source electrode connecting member 4 of the semiconductor chip 21 is a flat-plate-like electroconductive member made of a metal such as copper. The guard ring 7 is provided at the upper or lower marginal section of the silicon chip 1 and forms the boundary between the potential areas at the top and bottom of the silicon chip 1.

The semiconductor chip 11 (21) is disposed at, and connected to, the sides facing the top and bottom of the semiconductor chip 11 (more specifically, the top and bottom of the silicon chip 1), and is sandwiched from the sides facing the top and bottom of the semiconductor chip 11, between the electroconductive members 12 and 13 (22 and 23).

The side of the electroconductive member 12 that faces the top of the semiconductor chip 11 (more exactly, the top of the silicon chip 1), in other words, the connection surface with respect to the semiconductor chip 11 is connected to the top (source electrode connecting member 4) of the semiconductor chip via an electroconductive adhesive 14 so as to be electrically connected to the source electrode connecting member 4.

The side of the electroconductive member 22 that faces the top of the semiconductor chip 21 (more exactly, the top of the silicon chip 1) is connected to the top of the semiconductor chip (that is to say, the top of the silicon chip 1) via an electroconductive adhesive 24 so as to be electrically connected to the drain electrode 5. The electroconductive members 12 and 22 are heat-conductive block members made of a metal, for example, copper.

The side of the electroconductive member 13 that faces the bottom of the semiconductor chip 11 (more exactly, the bottom of the silicon chip 1), in other words, the connection surface with respect to the semiconductor chip 11 is connected to the bottom of the semiconductor chip (that is to say, the bottom of the silicon chip 1) via an electroconductive adhesive 15 so as to be electrically connected to the drain electrode 5. The side of the electroconductive member 23 that faces the bottom of the semiconductor chip 21 (more exactly, the bottom of the silicon chip 1), in other words, the connection surface with respect to the semiconductor chip 21 is connected to the bottom of the semiconductor chip (that is to say, the source electrode connecting member 4) via an electroconductive adhesive 25 so as to be electrically connected to the source electrode connecting member 4. The electroconductive members 13 and 23 are heat-conductive block members made of a metal, for example, copper.

In this way, in the present embodiment, double-side wired structure is implemented by sandwiching the semiconductor chip 11 (21) between, and from the top and bottom thereof, the electroconductive members 12 and 13 (22 and 23). Thereby, the number of components in both the positive-pole semiconductor module 10 and the negative-pole semiconductor module 20 is minimized and wireless bondingless processing is realized. In the present embodiment, the above-described structure, in turn, minimizes the number of wiring connections between the components constituting the current routes of both the positive-pole semiconductor module 10 and the negative-pole semiconductor module 20, and significantly reduces risks relating to rupture and the like. According to the present embodiment, therefore, the reliability of the inverter device 100 can be improved.

In the electroconductive member 12 (22), three through-holes are formed in parallel in the first direction. The semiconductor chip 11 (21) is connected to the central section of each through-hole in the first direction. That is to say, the electroconductive member 12 (22) is formed into a single bridge-like or arch-like member so that from the upper wall of the electroconductive member, side walls provided at both ends of the upper wall in the second direction, and two support walls by which the space between the side walls is split into three equal spaces in the second direction, the electroconductive member straddles the laminated structure consisting of the semiconductor chip 11 (21) and the electroconductive member 13 (23).

The side walls and support walls of the electroconductive member 12 (22) are each connected in electrically insulated form to the electroconductive member 12 (23), on the same surface as the installation surface of the electroconductive member 13 (23), that is to say, each such wall is connected to the top of the insulating member 50. In the three equally split spaces of the electroconductive member 12 (22), the laminated structure consisting of the semiconductor chip 11 (21) and the electroconductive member 13 (23) is stored so as to be sandwiched between the electroconductive members 12 and 13 (22 and 23) from both sides of the laminated structure in its laminating direction. The plate thickness of the electroconductive member 12 (23) is greater than the thickness of the semiconductor chip 11 (21).

Figure 6:
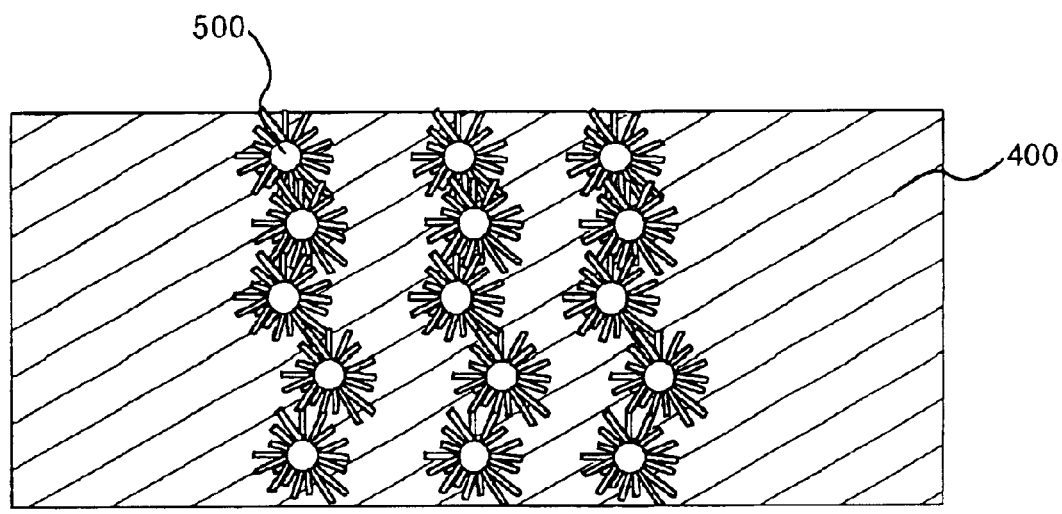
FIG. 6 is a cross-sectional view showing the materials composition of the electroconductive adhesive agent used to connect two components of the inverter device of FIG. 1.
Figure 7:
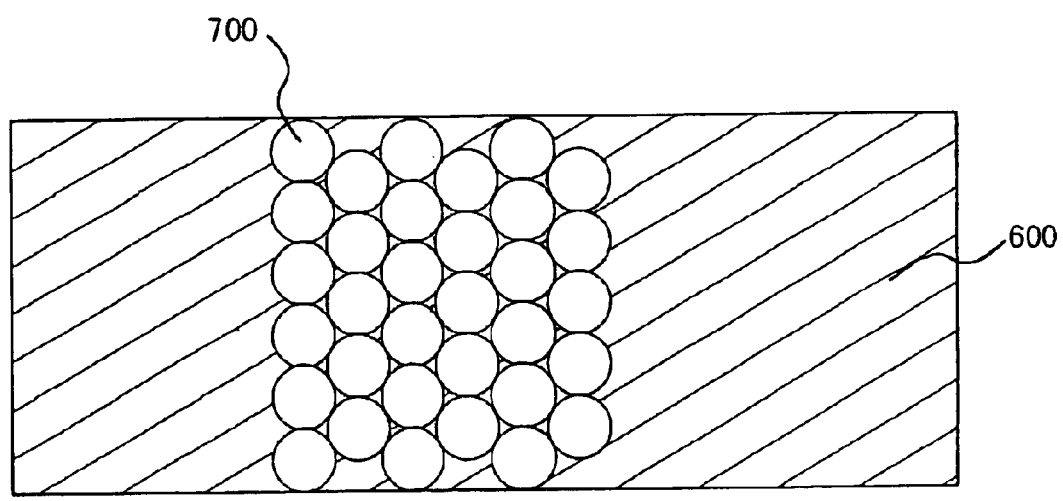
FIG. 7 is a cross-sectional view showing the materials composition of an electroconductive adhesive agent as a comparative example of FIG. 6.

The electroconductive adhesives 14, 15, 24, and 25 are each a mixture of metallic pieces (metallic filler) or metal particles and resin. FIG. 6 shows the cross-sectional structure of applied and cured electroconductive adhesives 14, 15, 24, and 25 in the present embodiment. In the present embodiment, mixtures of epoxy resin 400 and silver particles 500 having needle-like protrusions are used as the electroconductive adhesives 14, 15, 24, and 25. As is obvious from the figure, in the electroconductive adhesives 14, 15, 24, and 25 of the present embodiment, adjoining silver particles 500 are closely intermixed in the epoxy resin 400 and at the same time, the inside of the protrusions of the silver particles 500 is filled with the epoxy resin 400 so as not to create a clearance.

Compared with an electroconductive adhesive formed by mixing a global metallic filler 700 with resin 600, the electroconductive adhesives 14, 15, 24, and 25 in the present embodiment enable high electroconductivity to be achieved only by adding a small amount of metallic pieces or metal particles, and at the same time, high mechanical strength to be obtained. That is to say, to achieve electroconductivity equal to that used in the present embodiment, the electroconductive adhesive in which a global metallic filler and resin are mixed (see FIG. 7) must be filled with the metallic filler so as not to create a clearance.

However, since the amount of resin decreases correspondingly, mechanical strength will also decrease. Accordingly, to achieve high electroconductivity with a small amount of metallic pieces or metal particles and also to obtain high mechanical strength, it is preferable that such electroconductive adhesives 14, 15, 24, and 25 as used in the present embodiment should be used.

Examples of the electroconductive adhesives which contain a metallic filler having needle-like protrusions are introduced in the July 2001 Number of "Electronic Materials" that features electroconductive adhesives on pages 89–96.

Since it is low in both impedance and thermal resistance, the solder commonly used for bonding two members of laminated structure is excellent in electroconductivity and thermal conductivity. For an inverter device that releases heat from both faces of each semiconductor chip, thermal fatigue exerted on the surface of the solder can also be reduced by distributing the thermal stress.

However, as in the present embodiment, in the case of two-member connection of the inverter device in which, as the standards pertaining to power supplies are tightened, the magnitude of the current flowing through semiconductor devices further increases during automobile-mounted use under a severe heat-cycle environment, especially in the connection of a ceramic insulating substrate and a copper block member, there is the fear that the significant difference in linear expansion coefficient between both will exert thermal fatigue on the surface of the soldered connection and result in rupture stemming from this surface. For this reason, a bonding agent as low as solder in terms of both impedance and thermal resistance and higher than solder in terms of mechanical strength is required as a bonding agent alternative to solder.

In the present embodiment, therefore, such electroconductive adhesive as described above is used for two-member connection. Accordingly, in the present embodiment, during two-member connection of the inverter device in which, as the standards pertaining to power supplies are tightened, the magnitude of the current flowing through semiconductor devices further increases during automobile-mounted use under a severe heat-cycle environment, even if the difference in linear expansion coefficient between the two members is significant, thermal fatigue exerted on the surface of the connection can be reduced and the inverter device can be stably operated under a severe heat-cycle environment. In the present embodiment, therefore, the reliability of the inverter device can be improved.

In the present embodiment, since the inverter device is constructed so that heat is released from both faces of each semiconductor chip, it is also possible to further reduce the thermal fatigue exerted on the surface of the connection, and to further improve the reliability of the inverter device.

Although, in the present embodiment, an example in which the electroconductive adhesives 14 and 15 (24 and 25) are used for connection between the semiconductor chip 11 (21) and the electroconductive members 12 and 13 (22 and 23) has been described, these electroconductive adhesives can also be used for purposes such as connection between the source electrode 2 and source electrode connecting member 4 of the silicon chip 1 and between the electroconductive members 12, 13, 22, and 23 and the insulating member 50. Hereby, the reliability of the inverter device can be further improved.

The DC-use busbar 30 is equivalent to input wiring and consists of a positive-pole DC busbar 31 and a negative-pole DC busbar 32. The positive-pole DC busbar 31 is formed from the electroconductive member 12 by being integrated therewith, and the flat-plate-like external connection terminal section 31a of this busbar is formed so as to protrude the side end portion of the negative-pole DC busbar 32 outward at one end of the upper wall section in its second direction that constitutes the electroconductive member 12. The negative-pole DC busbar 32 is formed from the electroconductive member 22 by being integrated therewith, and the flat-plate-like external connection terminal section 32a of this busbar is formed so as to protrude the side end portion of the positive-pole DC busbar 31 outward at one end of the upper wall section in its second direction that constitutes the electroconductive member 22.

The AC-use busbars 40 consist of a u-phase AC busbar 41, a v-phase AC busbar 42, and a w-phase AC busbar 43. The u-phase AC busbar 41, the v-phase AC busbar 42, and the w-phase AC busbar 43 are formed by integrating the electroconductive member 12 of the positive-pole semiconductor module 10 and the electroconductive member 22 of the negative-pole semiconductor module 20 for each corresponding phase, and each such AC busbar is a flat-plate-like member extending, in the first direction, from the negative-pole semiconductor module 20 towards the positive-pole semiconductor module 10, and protruding from the positive-pole semiconductor module 10 towards the opposite side to the negative-pole semiconductor module 20.

An external connection terminal section 41a is formed at the section protruding from the positive-pole semiconductor module 10 of the u-phase AC busbar 41 towards the opposite side to the negative-pole semiconductor module 20. An external connection terminal section 42a is formed at the section protruding from the positive-pole semiconductor module 10 of the v-phase AC busbar 42 towards the opposite side to the negative-pole semiconductor module 20. An external connection terminal section 43a is formed at the section protruding from the positive-pole semiconductor module 10 of the w-phase AC busbar 43 towards the opposite side to the negative-pole semiconductor module 20.

According to the present embodiment, since the DC-use busbars 30 are constituted using the electroconductive member 12 of the positive-pole semiconductor module 10 and the electroconductive member 22 of the negative-pole semiconductor module 20 and the AC-use busbars 40 are constituted using the electroconductive member 13 of the positive-pole semiconductor module 10 and the electroconductive member 23 of the negative-pole semiconductor module 20, it is possible to reduce the number of components of the inverter device 100 and to simplify the configuration of the inverter device 100. According to the present embodiment, therefore, a compact and inexpensive inverter device 100 can be provided.

At the holed sections of the electroconductive members 12 and 22 in the first direction, a wiring member 70 that has been inserted from the sections holed towards the opposite side to the side of the electroconductive members 12 and 22 that faces the positive-pole semiconductor module 10 and the negative-pole semiconductor module 20, into these semiconductor modules, is connected to the gate electrode 6 of the semiconductor chip 11 (21) via a metallic ball 71.

Hereby, the wiring member 70 is electrically connected to the gate electrode 6. The wiring member 70 is a thin-plate-like or sheet-like signal-transmitting member that applies gate control signals 151 (switching control signals for turning on and off the MOS-FETs 171 to 173 and 181–183) from the control circuit block 150 to the gates of the MOS-FETs. More specifically, the wiring member 70 is either an electroconductive member covered with a resin film or an electroconductive member attached to one side of a resin film. The resin film is a flexible film formed from insulating resin. The metallic ball 71 is a global, electroconductive, and adhesive member formed from solder.

In the present embodiment, such wiring connection as described above is used to connect the gate electrode 6 and the wiring member 70. This is because, since the position of the gate electrode 6 in the area surrounded by the guard ring 7 provided on one face of the top or bottom of the silicon chip 1 is outer than that of the source electrode 2, it is necessary to ensure the required distance not affecting the electric field design of the guard ring 7, and at the same time to perform the wiring connection to the gate electrode 6. Also, in the present embodiment, in order to enable the above-described wiring connection, electrical connection between the source electrode 2 and the electroconductive members 12 and 23 is achieved using the following method:

That is to say, the source electrode 2 and the electroconductive members 12 and 23 are electrically connected via the source electrode connecting member 4. And the size of the connection surface of the source electrode connecting member 4 is limited to the size of the electrode surface of the source electrode 2 so that a wiring connection space can be obtained between the wiring member 70 and the gate electrode 6.

Also, the source electrode connecting member 4 has a plate thickness that enables the necessary isolation distance to be obtained between the guard ring 7 and the wiring member 70. Hereby, the necessary space for wiring connection is ensured between the silicon chip 1 and the electroconductive members 12 and 23.

According to the present embodiment heretofore described, since a heat-releasing channel is formed at both the top and bottom of the semiconductor chip 11 (21) by sandwiching this semiconductor chip 11 (21) between the electroconductive members 12 and 13 (22 and 23), from both the top and bottom of the semiconductor chip 11 (21), and since the cross-sectional area of the heat flow section of the heat-releasing channel is extended by connecting the electroconductive member 12 (22) to the same surface as the installation surface of the electroconductive member 12 (22), in other words, to the surface of the insulating member 50, so as to straddle the laminated structure formed by the semiconductor chip 11 (21) and the electroconductive member 13 (23), a heat stream 80 released from the top of the semiconductor chip 11 (21) and flowing in one direction towards the top of the laminating direction of the laminated structure is diffused to produce a heat stream 81 flowing in various directions with respect to the vertical face to the laminating direction of the laminated structure (in the figure, only the flow of heat in a perpendicular and horizontal direction with respect to the laminating direction of the laminated structure is shown).

After this, the heat stream 81, together with a heat stream 82 which is released from the bottom of the semiconductor chip 11 (21) and flowing downward in the laminating direction of the laminated structure, is released from a heat-releasing structure 60 to the outside via the insulating member 50.

Hereby, in the present embodiment, the thermal resistance of both the positive-pole semiconductor module 10 and the negative-pole semiconductor module 20 can be significantly reduced and increases in the temperatures of both modules can also be significantly reduced. According to the present inventors, it has been possible to empirically verify that the thermal resistance of both the positive-pole semiconductor module 10 and the negative-pole semiconductor module 20 can be reduced to about ⅓ of the corresponding conventional value and that increases in the temperatures of both modules can also be reduced to about ⅓ of the corresponding conventional values (that is to say, cooling performance can be improved to about 1.5 times that of a conventional product).

According to the present embodiment, therefore, by adopting even more compact semiconductor chips 11 and 21, the positive-pole semiconductor module 10 and the negative-pole semiconductor module 20 can be dimensionally reduced and increases in the temperatures of both modules can be controlled to stay within the permissible temperature range of the semiconductor chips 11 and 21, even if the amount of current flowing thereinto is increased by the tightening of the standards relating to the battery 200, the power supply mounted in an automobile.

Accordingly, the present embodiment makes it possible to provide a highly reliable, compact, and inexpensive inverter device 100 whose normal operation can be maintained even when used under a severe heat-cycle environment.

In addition, according to the present embodiment, since the electroconductive member 12 (22) is formed into a bridge shape or an arch shape, the cross-sectional area of the heat flow section of the heat-releasing channel can be extended within the range that satisfies the automobile-mounting dimensions of the inverter device 100, without extending more than necessary the size of the electroconductive member 12 (22) in the laminating direction or vertical direction of the laminated structure formed by the semiconductor chip 11 (21) and the electroconductive member 13 (23).

Although an example in which the heat-releasing structure 60 is connected to the bottom of the insulating member 50 has been described in the present embodiment, the thermal resistance of both the positive-pole semiconductor module 10 and the negative-pole semiconductor module 20 can be further reduced to about ½ of the corresponding conventional value by connecting a similar heat-releasing structure to the tops of the electroconductive members 12 and 22 as well.

Also, although an example in which wiring connection between the gate electrode 6 and the wiring member 70 is accomplished using the metallic ball 71 has been described in the present embodiment, wiring connection between the gate electrode 6 and the wiring member 70 can likewise be accomplished by connecting one end of a lead-out cable 72 (electroconductive wiring material) to the gate electrode 6, and then after pulling the other end of the lead-out cable 72 out from the semiconductor chip 11 or 21 while maintaining the necessary distance with respect to the guard ring 7, connecting the other end to the wiring member 70.

Also, as shown in FIGS. 10 to 13, the position of the gate electrode 6 may be inner than that of the source electrode 2, in the area surrounded by the guard ring 7. In such a case, one end of the lead-out cable 72 of which the other end is connected to the gate electrode 6 can be connected to the wiring member 70 by being pulled out from the semiconductor chip 11 or 21 via either a lead-out section 73 formed at a notch 74 in the source electrode connecting member 4, or a lead-out section 73 formed from a combination of a groove 74 and a hole 75, or a lead-out section formed by holing. Or when the electroconductive members 12 and 23 are to be connected without using the source electrode connecting member 4, similar wiring connection can be accomplished by providing the electroconductive members 12 and 23 with a similar lead-out section.

Reference signs mean the following parts in the disclosure:

10 . . . Positive-pole semiconductor module, 11, 21 . . . Semiconductor chips, 12, 13, 22, 23 . . . Electroconductive members, 14, 15, 24, 25 . . . Electroconductive adhesives, 20 . . . Negative-pole semiconductor module, 30 . . . Busbar, 40 . . . AC-use busbar, 50 . . . Insulating member, 60 . . . Heat-releasing member.

According to the present embodiment described above, it is possible to provide a semiconductor module whose cooling performance can be improved. According to the present embodiment, it is also possible to provide a highly reliable, compact, and inexpensive power conversion device whose normal operation can be maintained even when used under a severe heat-cycle environment.

What is claimed is:

1. A semiconductor module comprising:
   a semiconductor device having an electrode at both surfaces thereof; and
   electroconductive members electrically connected to the electrodes of said semiconductor device and having thermal conductivity,
   wherein said semiconductor device and said electroconductive members form a laminated structure section, and one of said electroconductive members of one laminated structure section is electrically connected in insulated form to the other of said electroconductive members on the same surface as the installation surface of the other electroconductive member so as to straddle the other laminated section formed by said semiconductor device and said electroconductive members.

2. A semiconductor module according to claim 1, wherein one of said electroconductive members is installed in connected form on each said insulating member and the other of said electroconductive members is only connected to each said insulating member.

3. A semiconductor module according to claim 1, wherein said semiconductor chip and each said electroconductive member are connected using an electroconductive adhesive in which metallic pieces or metallic particles are mixed with resin.

4. A semiconductor module according to claim 2, wherein said semiconductor chip and each said electroconductive member or each said electroconductive member and each said insulating member are connected using an electroconductive adhesive in which metallic pieces or metallic particles are mixed with resin.

5. A semiconductor module according to claim 3 wherein said metallic pieces or said metallic particles have needle-like or petal-like protrusions and said protrusions are in close contact between each other in said resin.

6. A semiconductor module according to claim 4 wherein said metallic pieces or said metallic particles have needle-like or petal-like protrusions and said protrusions are in close contact between each other in said resin.

7. A semiconductor module comprising:
   a semiconductor device having an electrode at both surfaces thereof;
   electroconductive members electrically connected to said electrodes and electroconductive members having thermal conductivity, said semiconductor device and said electroconductive members forming a laminated structure section;
   a positive-pole semiconductor module and a negative-pole semiconductor module, each electrically connected in insulated form to the other of said electroconductive members on the same surface as the installation surface of the other electroconductive member so as to straddle the other laminated section formed by said semiconductor device and said electroconductive members;
   input/output wiring electrically connected to said semiconductor device; and
   a heat-releasing structure by which the heat that has been transmitted to said electroconductive members is released to the outside.

8. A power conversion device according to claim 7 wherein one of said electroconductive members is installed in connected form on each said insulating member and the other of said electroconductive members is only connected to each said insulating member.

9. A power conversion device according to claim 7 wherein said input wiring comprises one of said electroconductive members of said positive-pole semiconductor module and the other of said electroconductive members of said negative-pole semiconductor module, and said output wiring is formed by electrically connecting the other of said electroconductive members of said positive-pole semiconductor module and the other of said electroconductive members of said negative-pole semiconductor module.

10. A power conversion device according to claim 7, wherein each said semiconductor device and each said electroconductive member are connected using an electroconductive adhesive which has metallic pieces or metallic particles mixed with resin.

11. A power conversion device according to claim 8 wherein each said semiconductor device and each said electroconductive member or each said electroconductive member and each said insulating member are connected using an electroconductive adhesive which has metallic pieces or metallic particles mixed with resin.

12. A power conversion device according to claim 10, wherein said metallic pieces or said metallic particles have needle-like or petal-like protrusions; said protrusions being in close contact between each other in said resin.

13. A power conversion device according to claim 11, wherein said metallic pieces or said metallic particles have needle-like or petal-like protrusions; said protrusions being in close contact between each other in said resin.

14. A power conversion device according to claim 7 wherein both said positive-pole semiconductor module and said negative-pole semiconductor module have a plurality of said semiconductor devices, with each said electroconductive member being connected to both sides of each said semiconductor device.

15. A power conversion device according to claim 7 wherein the conversion device has a control signal wiring member for applying control signals to said semiconductor device, with said control signal wiring member being connected to said semiconductor device via a spherical electroconductive adhesive.

16. A power conversion device according to claim 7 above, wherein the conversion device has a control signal wiring member for applying control signals to said semiconductor device, with said control signal wiring member being electrically connected to said semiconductor device via a lead-out wiring cable.

17. A power conversion device according to claim 7, wherein the conversion device has a control signal wiring member for applying control signals to said semiconductor device, with said control signal wiring member being electrically connected to said semiconductor device via a lead-out wiring cable pulled out to the outside through a notch or through-hole provided in each said electroconductive member.

18. A power conversion device according to claim 7 above, characterized in that said heat-releasing structure is connected to one or both of said electroconductive members.

* * * * *